(12) United States Patent
Jo et al.

(10) Patent No.: US 9,385,142 B2
(45) Date of Patent: Jul. 5, 2016

(54) LIQUID CRYSTAL DISPLAY AND MANUFACTURING METHOD THEREOF

(71) Applicant: SAMSUNG DISPLAY CO., LTD., Yongin, Gyeonggi-Do (KR)

(72) Inventors: Jung Yun Jo, Namyangju-si (KR); Chang Ok Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 163 days.

(21) Appl. No.: 14/064,925

(22) Filed: Oct. 28, 2013

(65) Prior Publication Data
US 2014/0167032 A1   Jun. 19, 2014

(30) Foreign Application Priority Data

Dec. 13, 2012 (KR) .................. 10-2012-0145414

(51) Int. Cl.
*H01L 27/12* (2006.01)
*G02F 1/1362* (2006.01)
*H01L 29/49* (2006.01)
*H01L 29/786* (2006.01)

(52) U.S. Cl.
CPC ........ *H01L 27/124* (2013.01); *G02F 1/136227* (2013.01); *G02F 1/136286* (2013.01); *H01L 29/4908* (2013.01); *H01L 29/7869* (2013.01); *G02F 2001/136295* (2013.01)

(58) Field of Classification Search
CPC ............ H01L 27/3272; H01L 27/3244; H01L 29/4908; H01L 29/42384
USPC ................................ 257/59–60, 72
See application file for complete search history.

(56) References Cited

U.S. PATENT DOCUMENTS

2009/0185126 A1*  7/2009  Kim .................. G02F 1/136286
                                                349/147
2012/0086881 A1   4/2012  Kim et al.
2012/0181533 A1   7/2012  Yoo et al.

FOREIGN PATENT DOCUMENTS

| JP | 07-321200       | 12/1995 |
|----|-----------------|---------|
| JP | 2827637         | 9/1998  |
| JP | 10-341022       | 12/1998 |
| JP | 2003-133330     | 5/2003  |
| JP | 2007-047797     | 2/2007  |
| JP | 2009-053658     | 3/2009  |
| KR | 1020070003501   | 1/2007  |
| KR | 1020090047346   | 5/2009  |
| KR | 1020100066233   | 6/2010  |
| KR | 1020100122404   | 11/2010 |
| KR | 1020110018246   | 2/2011  |
| KR | 1020110038572   | 4/2011  |
| KR | 1020110050038   | 5/2011  |
| KR | 1020110052228   | 5/2011  |
| KR | 1020080056811   | 6/2011  |
| KR | 1020110071313   | 6/2011  |
| KR | 1020110118999   | 11/2011 |

* cited by examiner

*Primary Examiner* — Cuong Q Nguyen
(74) *Attorney, Agent, or Firm* — F. Chau & Associates, LLC

(57) ABSTRACT

A liquid crystal display includes: an insulation substrate, a gate line disposed on the insulation substrate, a first field generating electrode disposed on the insulation substrate, a gate insulating layer disposed on the gate line and the first field generating electrode, a semiconductor disposed on the gate insulating layer and a data line disposed on the gate insulating layer. A value [N—H]/[Si—H] of the gate insulating layer is in a range of about 13 to about 25. Here, the value [N—H]/[Si—H] means a ratio of a bonding number [N—H] of nitrogen and hydrogen to a bonding number [Si—H] of silicon and hydrogen according to an analysis of an FT-IR spectrometer.

18 Claims, 10 Drawing Sheets

(a)

(b)

LIQUID CRYSTAL DISPLAY AND MANUFACTURING METHOD THEREOF

CROSS-REFERENCE TO RELATED APPLICATION

This application claims priority to Korean Patent Application No. 10-2012-0145414 filed on Dec. 13, 2012, the entire disclosure of which is hereby incorporated by reference herein in its entirety.

TECHNICAL FIELD

The present disclosure relates to a liquid crystal display and a manufacturing method thereof.

DISCUSSION OF THE RELATED ART

Liquid crystal displays (LCDs) are one of the most widely used flat panel displays, and they display images by applying voltages to field-generating electrodes to generate an electric field in an LC layer that determines orientations of LC molecules therein to adjust polarization of incident light.

The liquid crystal display has benefits in that light weight and thin formation thereof are readily obtained. However, a possible drawback of the liquid crystal display is that lateral visibility may be lower than front visibility, and liquid crystal arrangements and driving methods of various types have been developed to solve the drawback. To realize a wide viewing angle, a liquid crystal display forming a pixel electrode and a reference electrode on one substrate has been spotlighted.

Meanwhile, as the area of a display increases, signal lines are also lengthened, and accordingly, resistance increases. If resistance increases as such, difficulties such as signal delay or voltage drop may occur. To solve these difficulties, it may be necessary to form signal lines of a material having low specific resistance.

However, when forming wiring of the low-resistance metal, the surface of the low-resistance metal layer reacts with nitrogen of the insulating layer such that a hillock may be generated. To prevent this protrusion, a method of processing with hydrogen plasma has been suggested.

However, when processing with hydrogen plasma before depositing the insulating layer, indium in the field generating electrode made of a transparent conductor is combined with hydrogen thereby generating a haze.

SUMMARY

Exemplary embodiments of the present invention provide a liquid crystal display in which a hillock of a low-resistance metal and a haze of a transparent conductor are simultaneously prevented when forming a gate wire of the low-resistance metal and a field generating electrode of a transparent conductor on a substrate, and depositing a gate insulating layer thereon, and a manufacturing method thereof.

A liquid crystal display according to an exemplary embodiment of the present invention includes: an insulation substrate, a gate line disposed on the insulation substrate, a first field generating electrode disposed on the insulation substrate, a gate insulating layer disposed on the gate line and the first field generating electrode, a semiconductor disposed on the gate insulating layer and a data line disposed on the gate insulating layer. A value [N—H]/[Si—H] of the gate insulating layer is in a range of about 13 to about 25. Here, the value [N—H]/[Si—H] means a ratio of a bonding number [N—H] of nitrogen and hydrogen to a bonding number [Si—H] of silicon and hydrogen according to an analysis of an FT-IR spectrometer.

The gate insulating layer may include a first film contacting the gate line and the first field generating electrode, a second film disposed on the first film, and a third film disposed on the second film.

The semiconductor may contact the third film, and the value [N—H]/[Si—H] of the first film may be in a range of about 13 to about 25.

The value [N—H]/[Si—H] of the second film of the gate insulating layer may be in a range of about 0.5 to about 1.0.

The gate insulating layer may be a single layer.

The gate line may be made of a low-resistance metal.

The first field generating electrode may be made of a transparent conductor including indium.

A second field generating electrode disposed on the substrate may be further included.

The second field generating electrode may overlap the first field generating electrode via an insulating layer.

At least one of the first field generating electrode and the second field generating electrode may have a plurality of branch electrodes.

A manufacturing method of a liquid crystal display according to an exemplary embodiment of the present invention includes: forming a gate line on an insulation substrate, forming a first field generating electrode on the insulation substrate; depositing a gate insulating layer having a value [N—H]/[Si—H] of about 13 to about 25 on the gate line and the first field generating electrode. The value [N—H]/[Si—H] means a ratio of a bonding number [N—H] of nitrogen and hydrogen to a bonding number [Si—H] of silicon and hydrogen according to an analysis of an FT-IR spectrometer. The method further includes forming a semiconductor on the gate insulating layer and forming a data line on the gate insulating layer.

The forming of the gate insulating layer may include depositing an N-rich silicon nitride (SiNx) having a high nitrogen content by depositing a silicon nitride layer at a slow deposition speed in a gas atmosphere including nitrogen.

A plasma treatment may be omitted before forming the gate insulating layer.

The forming of the gate insulating layer may include: depositing a first film contacting the gate line and the first field generating electrode; depositing a second film on the first film and depositing a third film on the second film.

The depositing of the first film and the depositing of the third film may include depositing an N-rich silicon nitride (SiNx) having a high nitrogen content by depositing a silicon nitride layer at a slow deposition speed in a gas atmosphere including nitrogen.

The depositing of the second film may include depositing a Si-rich silicon nitride (SiNx) having a high silicon content by depositing a silicon nitride layer at a fast deposition speed in a gas atmosphere including nitrogen.

The forming of the semiconductor includes forming the semiconductor on the third film, and the silicon nitride having a value [N—H]/[Si—H] of about 13 to about 25 may be deposited in the deposition of the third film.

The depositing of the second film, includes depositing silicon nitride having a value [N—H]/[Si—H] of about 0.5 to about 1.

The forming of the gate insulating layer includes depositing silicon nitride having a value [N—H]/[Si—H] of about 13 to about 25 as a single layer.

The forming of the gate line may include depositing a low-resistance metal layer.

The forming of the first field generating electrode may include depositing a transparent conductor including indium.

The method may further include forming a second field generating electrode on the substrate.

The forming of the second field generating electrode includes forming the second field generating electrode overlapping the first field generating electrode via an insulating layer.

At least one of the first field generating electrode and the second field generating electrode may be formed with a plurality of branch electrodes.

In accordance with an exemplary embodiment of the present invention, a liquid crystal display is provided. The liquid crystal display includes a lower panel including an insulation substrate, a plurality of gate lines disposed on the insulation substrate, a first field generating electrode disposed on the insulation substrate; a gate insulating layer disposed on the gate lines and the first field generating electrode, wherein the gate insulating layer includes at least one layer including an N-rich silicon nitride (SiNx) having a high nitrogen content, in which a value [N—H]/[Si—H] of the gate insulating layer is in a range of about 13 to about 25, and in which the value [N—H]/[Si—H] means a ratio of a bonding number [N—H] of nitrogen and hydrogen to a bonding number [Si—H] of silicon and hydrogen according to analysis of an FT-IR spectrometer.

The liquid crystal display further includes a semiconductor disposed on the gate insulating layer, a data conductor including a plurality of data lines, a plurality of drain electrodes, and a reference voltage line is disposed on the gate insulating layer, in which the reference voltage lines are disposed between the data lines and extend parallel to the data lines, and wherein the reference voltage line includes an expansion disposed between a portion of the gate lines, a passivation layer disposed on the data conductor, on an exposed portion of the semiconductor, and on the gate insulating including a portion of the gate insulating layer disposed on the first field generating electrode, an upper panel disposed facing the lower panel and an a liquid crystal layer disposed between the upper panel and the lower panel.

In the liquid crystal display and the manufacturing method thereof according to an exemplary embodiment of the present invention, the gate insulating layer made of silicon nitride having a high nitrogen content is deposited on a gate wire made of a low-resistance metal and a field generating electrode made of a transparent conductor, thereby preventing the hillock of the low-resistance metal and simultaneously preventing haze of the transparent conductor.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Figure 1:
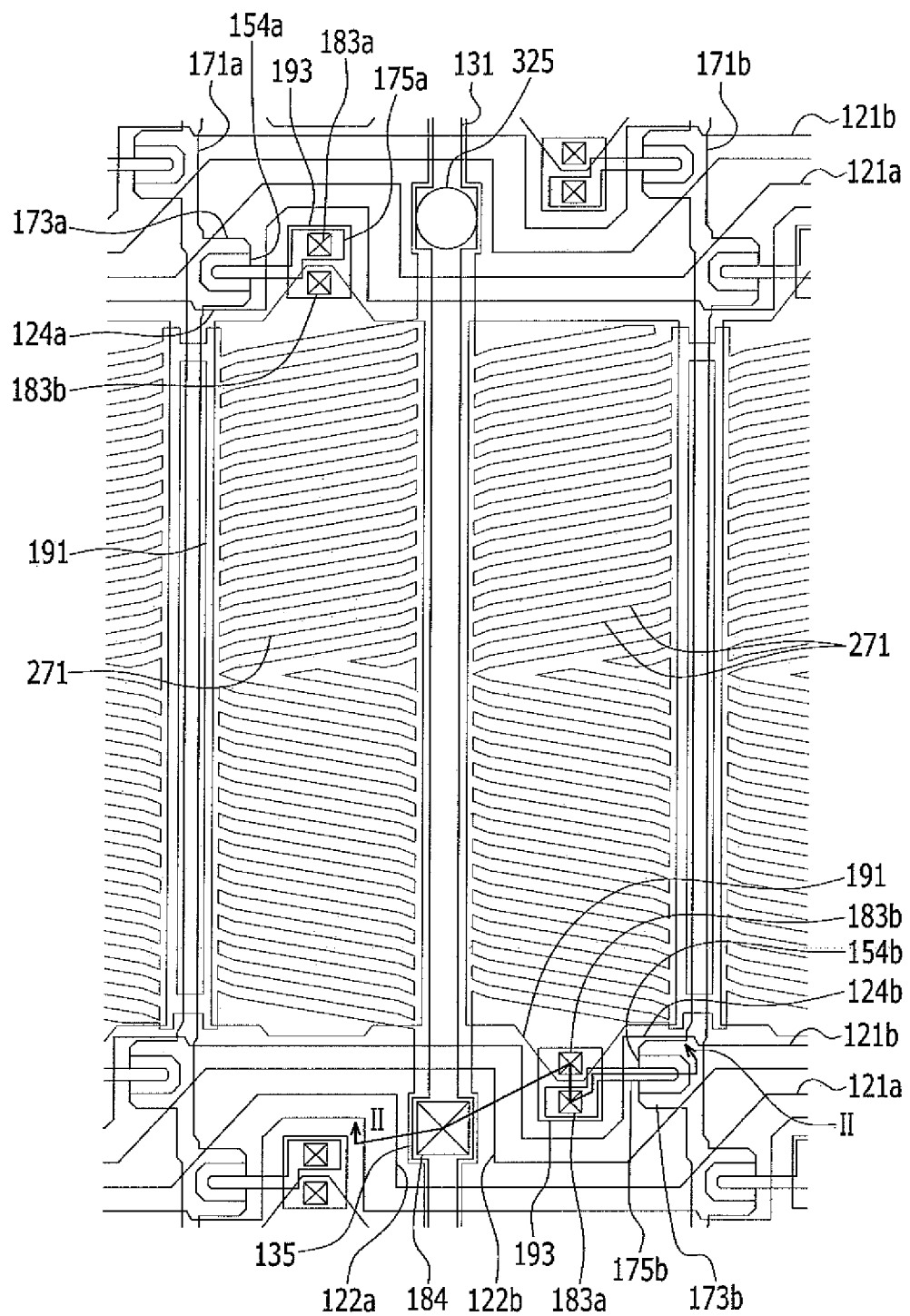
FIG. 1 is a layout view of a liquid crystal display according to an exemplary embodiment of the present invention.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Now, a liquid crystal display according to an exemplary embodiment of the present invention will be described with reference to FIG. 1 and FIG. 2. FIG. 1 is a layout view of a liquid crystal display according to an exemplary embodiment of the present invention, and FIG. 2 is a cross-sectional view of the liquid crystal display of FIG. 1 taken along the line II-II.

Figure 2:
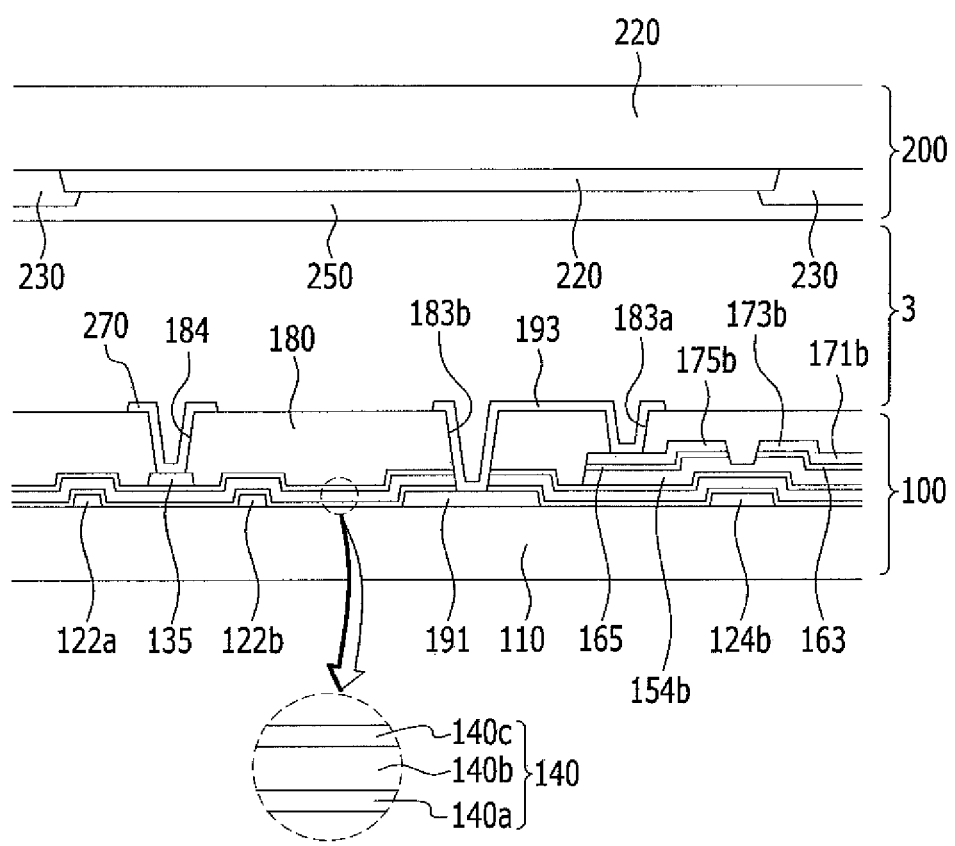
FIG. 2 is a cross-sectional view of the liquid crystal display of FIG. 1 taken along the line II-II.

Referring to FIG. 1 and FIG. 2, a liquid crystal display according to an exemplary embodiment of the present invention includes, for example, a lower panel 100 and an upper panel 200 facing each other, and a liquid crystal layer 3 interposed between the two display panels 100 and 200.

The lower panel 100 will be described.

For example, a plurality of gate lines 121a and 121b and a plurality of first field generating electrodes 191 are formed on an insulation substrate 110 made of transparent glass plastic or quartz. Further, in an exemplary embodiment, the glass may include, for example, tempered glass. In an exemplary embodiment, the insulation substrate 110 may be formed of, for example, one of polycarbonate (PC), polyester (PET), polypropylene (PP), polyethylene (PE) and polymethyl methacrylate (PMMA).

The gate lines 121a and 121b are disposed per each row of pixels, and include, for example, a first gate line 121a disposed upward according to the row of pixels and a second gate line 121b disposed downward according to the row of pixels. The first gate line 121a is disposed, for example, closer to the second gate line 121b disposed at the adjacent row of a previous pixel, and the second gate line 121b is disposed, for example, closer to the first gate line 121a disposed at the adjacent row of a following pixel. Accordingly, the first gate line 121a and the second gate line 121b disposed at the row of the current pixel form a pair along with the second gate line 121b and the first gate line 121a disposed at the adjacent row of pixels and are disposed between the rows of pixels.

The first gate line 121a includes, for example, a first gate electrode 124a, and the second gate line 121b includes a second gate electrode 124b. The first gate line 121a includes, for example, a first longitudinal portion 122a, and the second gate line 121b includes a second longitudinal portion 122b.

The first and second gate lines 121a and 121b may include, for example, a low-resistance metal. For example, the first and second gate lines 121a and 121b may include a copper-containing metal such as copper (Cu) or copper alloys, an aluminum-containing metal such as aluminum (Al) or aluminum alloys (e.g. aluminum neodymium), a silver-containing metal such as silver (Ag) or silver alloys, or a gold containing metal such as gold (Au) or gold alloys, and any mixtures thereof.

The first field generating electrode 191 (e.g. pixel electrode) may be made of, for example, a transparent conductive material such as indium tin oxide (ITO), indium zinc oxide (IZO), aluminum doped ZnO (AZO), cadmium zinc oxide (CZO), indium gallium zinc oxide (IGZO), another suitable material, or a combination of the above.

A gate insulating layer 140 is formed on the first and second gate lines 121a and 121b and the first field generating electrodes 191.

The gate insulating layer 140 includes, for example, a first film 140a contacting underlying first and second gate lines 121a and 121b and the first field generating electrodes 191, a second film 140b positioned on the first film 140a, and a third film 140c positioned on the second film 140b.

The first film 140a and the third film 140c may made of, for example, a N-rich silicon nitride (SiNx) having a high nitrogen content, and the second film 140b may be made of, for example, a Si-rich silicon nitride (SiNx) having a high silicon content.

In the first film 140a and the third film 140c formed of silicon nitride having a high nitrogen content, a value of [N—H]/[Si—H] may be in a range of, for example, about 13 to about 25. For example, when analyzing the first film 140a and the third film 140c of the gate insulating layer 140 through an FT-IR spectrometer, a ratio of a bonding number [N—H] of nitrogen and hydrogen to a bonding number [Si—H] of silicon and hydrogen, that is, the value of [N—H]/[Si—H], is in the range of, for example, about 13 to about 25.

In the second film 140b including the silicon nitride with a high silicon content, the value of [N—H]/[Si—H] may be, for example, in a range of about 0.5 to about 1.5. For example, when analyzing the second film 140b of the gate insulating layer 140 through an FT-IR spectrometer, a ratio of a bonding number [N—H] of nitrogen and hydrogen to a bonding number [Si—H] of silicon and hydrogen, that is, the value of [N—H]/[Si—H], is in a range of, for example, about 0.5 to about 1.5.

The first film 140a of the gate insulating layer 140 contacting the first and second gate lines 121a and 121b and the first field generating electrodes 191 is formed of, for example, silicon nitride having the high nitrogen content of the value [N—H]/[Si—H] of about 13 to about 25 measured with an FT-IR spectrometer, thereby preventing the hillock with the low-resistance metal such as copper while omitting the hydrogen plasma treatment. Therefore, the haze of the transparent conductor including indium may be prevented.

In the liquid crystal display according to the present exemplary embodiment, the gate insulating layer 140 includes, for example, the first film 140a, the second film 140b positioned on the first film 140a, and the third film 140c positioned on the second film 140b. The first film 140a and the third film 140c are made of the N-rich silicon nitride (SiNx) having a high nitrogen content, and the second film 140b is made of the Si-rich silicon nitride having a high silicon content.

However, in an exemplary embodiment, the gate insulating layer 140 of the liquid crystal display may include, for example, the first film made of the N-rich silicon nitride (SiNx) having a high nitrogen content, the second film made of the Si-rich silicon nitride having a high silicon content, the third film made of the N-rich silicon nitride (SiNx) having the high nitrogen content, a fourth film made of the Si-rich silicon nitride having a high silicon content, and a fifth film made of the N-rich silicon nitride (SiNx) having a high nitrogen content, and the first film to the fifth film may be sequentially deposited.

Also, according to an exemplary embodiment of the present invention, the gate insulating layer 140 of the liquid crystal display may include, for example, the first film made of the N-rich silicon nitride (SiNx) having a high nitrogen content, the second film made of the Si-rich silicon nitride having a high silicon content, the third film made of the N-rich silicon nitride (SiNx) having a high nitrogen content, the fourth film made of the N-rich silicon nitride (SiNx) having a high nitrogen content, the fifth film made of the Si-rich silicon nitride having a high silicon content, and a sixth film made of the N-rich silicon nitride (SiNx) having a high nitrogen content, and the first film to the sixth film may be sequentially deposited.

A plurality of semiconductors 154a and 154b including, for example, a first semiconductor 154a and a second semiconductor 154b are formed on the gate insulating layer 140. The first and second semiconductors 154a and 154b may be, for example, oxide semiconductors. The first semiconductor 154a and the second semiconductor 154b may, for example, be connected to each other. For example, the first and second semiconductors 154a and 154b may each include at least one of zinc oxide, zinc-tin oxide, zinc-indium oxide, indium oxide, titanium oxide, indium-gallium-zinc oxide, and indium-zinc-tin oxide.

As described above, the first film 140a contacting the first and second semiconductors 154a and 154b among the gate insulating layer 140 includes the silicon nitride having a high nitrogen content, and the silicon nitride layer having a value of [N—H]/[Si—H] of about 13 to about 25 measured by the FT-IR spectrometer, thereby increasing the contact characteristic between the gate insulating layer 140 and the first and second semiconductors 154a and 154b.

A plurality of ohmic contacts 163 and 165 are disposed on the semiconductors 154a and 154b. The ohmic contacts 163 and 165 are disposed as, for example, a pair on the first and second semiconductors 154a and 154b while respectively facing each other with respect to the first and second gate electrodes 124a and 124b. The ohmic contacts 163 and 165 may be made of, for example, n+ hydrogenated a-Si heavily doped with an N-type impurity such as phosphorous, or they may be made of a silicide. However, when the semiconductors 154a and 154b are made of the oxide semiconductor, the ohmic contacts 163 and 165 may, for example, be omitted. When the semiconductors 154a and 154b are made of the oxide semiconductor, a barrier layer and a capping layer may be formed, for example, on and under the semiconductors 154a and 154b.

A data conductor including, for example, a plurality of data lines 171a and 171b, a plurality of drain electrodes 175a and 175b, and a plurality of reference voltage lines 131 is formed on the ohmic contacts 163 and 165.

The data lines 171a and 171b transmitting the data signal, for example, mainly extend in a longitudinal direction thereby intersecting the gate lines 121a and 121b. The data lines 171a and 171b include, for example, a first data line 171a and a second data line 171b that are disposed with two pixel electrodes 191 interposed therebetween. The first and second data lines 171a and 171b may include, for example, a low-resistance metal. For example, the first and second data lines 171a and 171b may include a copper-containing metal such as copper (Cu) or copper alloys, an aluminum-containing metal such as aluminum (Al) or aluminum alloys (e.g. aluminum neodymium), a silver-containing metal such as silver (Ag) or silver alloys, or a gold-containing metal such as gold (Au) or gold alloys, and any mixtures thereof.

For example, each of the first and second data lines 171a and 171b are disposed one by one for two columns of the pixels, and the first and second data lines 171a and 171b are alternately connected to the pixel electrodes 191 disposed at the left side and the right side of the first and second data lines 171a and 171b according to the column of the pixels. As described, the first and second data lines 171a and 171b are respectively connected to two pixel electrodes 191 disposed at two columns of the pixels according to the column of the pixels thereby applying the data voltage such that the number of first and second data lines 171a and 171b may be reduced by half. Accordingly, the cost of the liquid crystal display may be reduced.

The first data line 171a includes, for example, a first source electrode 173a extending toward the first gate electrode 124a, and the second data line 171b includes, for example, a second source electrode 173b toward the second gate electrode 124b.

The first drain electrode 175a includes, for example, an end facing the first source electrode 173a with respect to the first gate electrode 124a and the other end having a wide area.

The second drain electrode 175b includes, for example, an end facing the second source electrode 173b with respect to the second gate electrode 124b and the other end having a wide area.

In the case of the liquid crystal display according to an exemplary embodiment of the present invention, the first field generating electrode 191 is formed and is then covered by the gate insulating layer 140 and the data conductor is formed thereon such that the data conductor being damaged by an etchant of the first field generating electrode 191 when forming the pixel electrode 191 directly on the data conductor may be prevented.

The reference voltage line 131 is, for example, disposed between the first and second data lines 171a and 171b and extends parallel to the first and second data lines 171a and 171b. The reference voltage line 131 includes, for example, a plurality of expansions 135.

The expansion 135 of the reference voltage line 131 is disposed, for example, between the longitudinal portions 122a and 122b of the first gate line 121a and the second gate line 121b.

As described, the expansion 135 of the reference voltage line 131 is disposed between the longitudinal portions 122a and 122b of the first gate line 121a and the second gate line 121b such that the area occupied by the first and second gate lines 121a and 121b and the expansion 135 of the reference voltage line 131 may be reduced.

The reference voltage line 131 is disposed, for example, between two first field generating electrodes 191 of two pixel areas disposed adjacent thereto in the pixel row direction, thereby preventing light leakage between the two first field generating electrodes 191.

The first/the second gate electrode 124a/124b, the first/the second source electrode 173a/173b, and the first/the second drain electrode 175a/175b form a thin film transistor (TFT) as a switching element along with the first/the second semiconductor 154a/154b. The first and second semiconductors 154a and 154b except for the channel region of the thin film transistor may have, for example, the same plane shape as the first and second data lines 171a and 171b, the first and second drain electrodes 175a and 175b, and the underlying ohmic contacts 163 and 165.

A passivation layer 180 is disposed on the data conductors 171a, 171b, 175a, 175b, and 131 and the exposed first and second semiconductors 154a and 154b. For example, the passivation layer 180 may be formed of, for example, an inorganic insulating material or an organic insulating material. For example, the passivation layer 180 may be formed of an inorganic insulating material such as silicon oxide (SiOx), silicon nitride (SiNx), silicon oxynitride (SiONx), or any combination thereof. The passivation layer 180 may also be formed of an organic insulating material such as, for example, benzocyclobutene (BCB), perfluorocyclobutane (PFCB), fluorinated para-xylene, an acrylic resin, or a color resin. For example, when the passivation layer 180 is made of the organic material, the passivation layer 180 may be a color filter 230, and in this case, a color filter 230 disposed in the upper panel 200 is omitted. Also, when, for example, the passivation layer 180 is the color filter 230, a light blocking member 220 disposed in the upper panel 200 may be disposed in the lower panel 100, and in this case, the light blocking member 220 disposed in the upper panel 200 is omitted.

In the case of the liquid crystal display according to an exemplary embodiment of the present invention, the passivation layer 180 is formed, for example, on the first field generating electrode 191 covered by the gate insulating layer 140 such that deterioration of transmittance according to a haze phenomenon of the first field generating electrode 191 made of ITO when forming the passivation layer 180 may be prevented.

The passivation layer 180 has, for example, a first contact hole 183a exposing the first and second drain electrodes 175a and 175b, and the passivation layer 180 and the gate insulating layer 140 have, for example, a second contact hole 183b exposing a portion of the first field generating electrode 191. The passivation layer 180 has, for example, a third contact hole 184 exposing a portion of a plurality of expansions 135 of the reference voltage line 131. According to the liquid crystal display according to an exemplary embodiment of the present invention, the first contact hole 183a and the second contact hole 183b may alternatively be formed, for example, as one contact hole. That is, the passivation layer 180 and the gate insulating layer 140 may have one contact hole exposing the portion of the first and second drain electrodes 175a and 175b and the portion of the first field generating electrode 191 together.

In the liquid crystal display according to the present exemplary embodiment, the third contact hole 184 exposing the reference voltage line 131, for example, does not overlap the first and second gate lines 121a and 121b. As described, the third contact hole 184 exposing the reference voltage line 131 is departed from the first and second gate lines 121a and 121b such that a short of the first and second gate lines 121a and 121b and the reference voltage line 131 due to penetration of static electricity that may be generated when forming the third contact hole 184 in the gate insulating layer 140 may be prevented.

Also, the expansion 135 of the reference voltage line 131, for example, does not overlap the first and second gate lines

121a and 121b such that the step is not formed on the expansion 135 of the reference voltage line 131 and such that the third contact hole 184 may be symmetrically formed with a height difference according to position. Accordingly, the reliability of the electrical connection of the reference voltage line 131 and the second field generating electrode 270 through the third contact hole 184 may be increased.

A second field generating electrode 270 and a connecting member 193 are formed on the passivation layer 180. The second field generating electrode 270 and the connecting member 193 may be formed of, for example, a transparent conductive material such as indium tin oxide (ITO), indium zinc oxide (IZO), aluminum doped ZnO (AZO), cadmium zinc oxide (CZO), indium gallium zinc oxide (IGZO), another suitable material, or a combination of the above.

Each second field generating electrode 270 includes, for example, a plurality of branch electrodes 271, and second field generating electrodes 270 disposed in adjacent pixels are connected through the connection portion 272.

The second field generating electrode 270 is physically and electrically connected to the reference voltage line 131 through, for example, the third contact hole 184 of the passivation layer 180 thereby receiving the reference voltage.

A plurality of branch electrodes 271 of the second field generating electrode 270, for example, overlap the first field generating electrode 191 with a plate shape.

The connecting member 193, for example, covers the first contact hole 183a exposing a portion of the first and second drain electrodes 175a and 175b and the second contact hole 183b exposing a portion of the first field generating electrode 191 such that the first and second drain electrodes 175a and 175b and the first field generating electrode 191 are physically and electrically connected to each other.

The first field generating electrode 191 is electrically connected to the first and second drain electrodes 175a and 175b through, for example, the connecting member 193 thereby receiving the data voltage.

The first field generating electrode 191 applied with a data voltage forms an electric field along with the second field generating electrode 270 applied with the common voltage to the liquid crystal layer 3. That is, the first field generating electrode 191 and the second field generating electrode 270 form an electric field therebetween, and the electric field is applied to the liquid crystal layer 3.

Hereinafter, the upper panel 200 will be described.

The light blocking member 220 is formed, for example, on a second insulation substrate 210 made of transparent glass, plastic or quartz. Further, in an exemplary embodiment, the glass may include, for example, tempered glass. In an exemplary embodiment, the insulation substrate 210 may be formed of, for example, one of polycarbonate (PC), polyester (PET), polypropylene (PP), polyethylene (PE) and polymethyl methacrylate (PMMA). The light blocking member 770 is called, for example, a black matrix and serves to prevent light leakage.

The plurality of color filters 230 is further formed on the second substrate 210. The color filters 230 are, for example, mostly present in a region surrounded by the light blocking member 220, and may be elongated along a pixel electrode 191 column in a vertical direction. Each of the color filters 230 may display one of primary colors such as three primary colors of red, green, and blue. Examples of the primary colors may include, for example, the three primary colors of red, green and blue, or yellow, cyan, magenta, and the like. Although not shown, the color filters may further include, for example, a color filter displaying a mixed color of the primary colors or white, other than the primary colors.

An overcoat 250 is formed, for example, on the color filter 230 and the light blocking member 220. The overcoat 250 may be made of, for example, an (organic) insulator. In addition, the overcoat 250 may prevent the color filter 230 from being exposed, and provide a flat surface. For example, in an exemplary embodiment, the overcoat 250 may be formed of an (organic) insulator such as, for example, an acrylic resin, an epoxy resin, a polyimide resin, a polyamide resin, a benzocyclobutene (BCB) resin, and a phenolic resin. Alternatively, in an exemplary embodiment, the overcoat 250 may be omitted.

A second alignment layer (not shown) is coated on an inner surface of the upper panel 200.

A spacer 325 is disposed, for example, between the lower panel 100 and the upper panel 200. The spacer 325 is disposed, for example, at a position overlapping signal lines such as the first and second gate lines 121a and 121b, the reference voltage lines 131, and the first and second data lines 171a and 171b. In the present exemplary embodiment, the spacer 325 is positioned, for example, in a region where the second gate electrode 124b overlaps the second data line 171b. However, in the liquid crystal display according to an exemplary embodiment of the present invention, the spacer 325 may, for example, be disposed at a position overlapping signal lines such as the first and second gate lines 121a and 121b, the reference voltage lines 131, and the first and second data lines 171a and 171b.

As such, the spacer 325 is disposed at the position overlapping the signal lines such as the first and second gate lines 121a and 121b, the reference voltage line 131 and the first and second data lines 171a and 171b, so that a desired cell gap may be maintained while reducing the height of the spacer 325. As the spacer 325 height is reduced, the width of the spacer 325 may be reduced and thus the width of the light blocking member for covering the spacer may be narrowed. Consequently, it is possible to prevent the aperture ratio of the liquid crystal display from being reduced.

The liquid crystal layer 3 interposed between the lower panel 100 and the upper panel 200 contains liquid crystal molecules (not shown), and the liquid crystal molecules may be aligned such that, for example, long axes thereof are horizontal to the surfaces of the two display panels 100 and 200 in the absence of an electric field.

The liquid crystal layer 3 may have positive dielectric anisotropy or negative dielectric anisotropy. Liquid crystal molecules of the liquid crystal layer 3 may be aligned so as to have a pretilt in a predetermined direction, and the pretilt direction of the liquid crystal molecules may be changed depending on the dielectric anisotropy of the liquid crystal layer 3.

A backlight unit (not shown) may be additionally included outside the first substrate 110 of the lower panel 100 to generate light and provide the light to the two display panels 100 and 200.

The first field generating electrode 191 to which the data voltage is applied generates an electric field in the liquid crystal layer 3 along with the second field generating electrode 270 receiving the common voltage to thereby determine orientation of the liquid crystal molecules of the liquid crystal layer 3 and display a corresponding image.

As described above, in the liquid crystal display according to an exemplary embodiment of the present invention, the first film 140a of the gate insulating layer 140 contacting the first and second gate lines 121a and 121b and the first field generating electrode 191 is formed of silicon nitride having a high nitrogen content of the value [N—H]/[Si—H] of about 13 to about 25, measured by an FT-IR spectrometer, thereby preventing the hillock with the low-resistance metal such as copper while omitting the hydrogen plasma treatment. Therefore, the haze of the transparent conductor including indium may be prevented.

Also, the third film 140c of the gate insulating layer 140 contacting the first and second semiconductors 154a and 154b is formed of the silicon nitride layer including silicon nitride to have a high nitrogen content of the value [N—H]/[Si—H] of about 13 to about 25 measured by an FT-IR spectrometer such that the contact characteristic between the gate insulating layer 140 and the first and second semiconductors 154a and 154b may be good, thereby preventing characteristic deterioration of the first and second semiconductors 154a and 154b.

According to the liquid crystal display according to an exemplary embodiment of the present invention, the gate insulating layer 140 has a multilayer structure including a layer made of the silicon nitride having a high nitrogen content and a layer made of the silicon nitride having a high silicon content. The film of the gate insulating layer 140 contacting the first and second gate lines 121a and 121b and the first field generating electrode 191 is formed of silicon nitride having a high nitrogen content of the value [N—H]/[Si—H] of about 13 to about 25 measured by an FT-IR spectrometer, thereby preventing the hillock with the low-resistance metal such as copper while omitting the hydrogen plasma treatment. Therefore, the haze of the transparent conductor including indium may be prevented. Also, the film of the gate insulating layer 140 contacting the first and second semiconductors 154a and 154b is formed of silicon nitride having a high nitrogen content of the value [N—H]/[Si—H] of about 13 to about 25 measured by an FT-IR spectrometer such that the contact characteristic between the gate insulating layer 140 and the first and second semiconductors 154a and 154b is good, thereby preventing the characteristic deterioration of the first and second semiconductors 154a and 154b.

Figure 3:
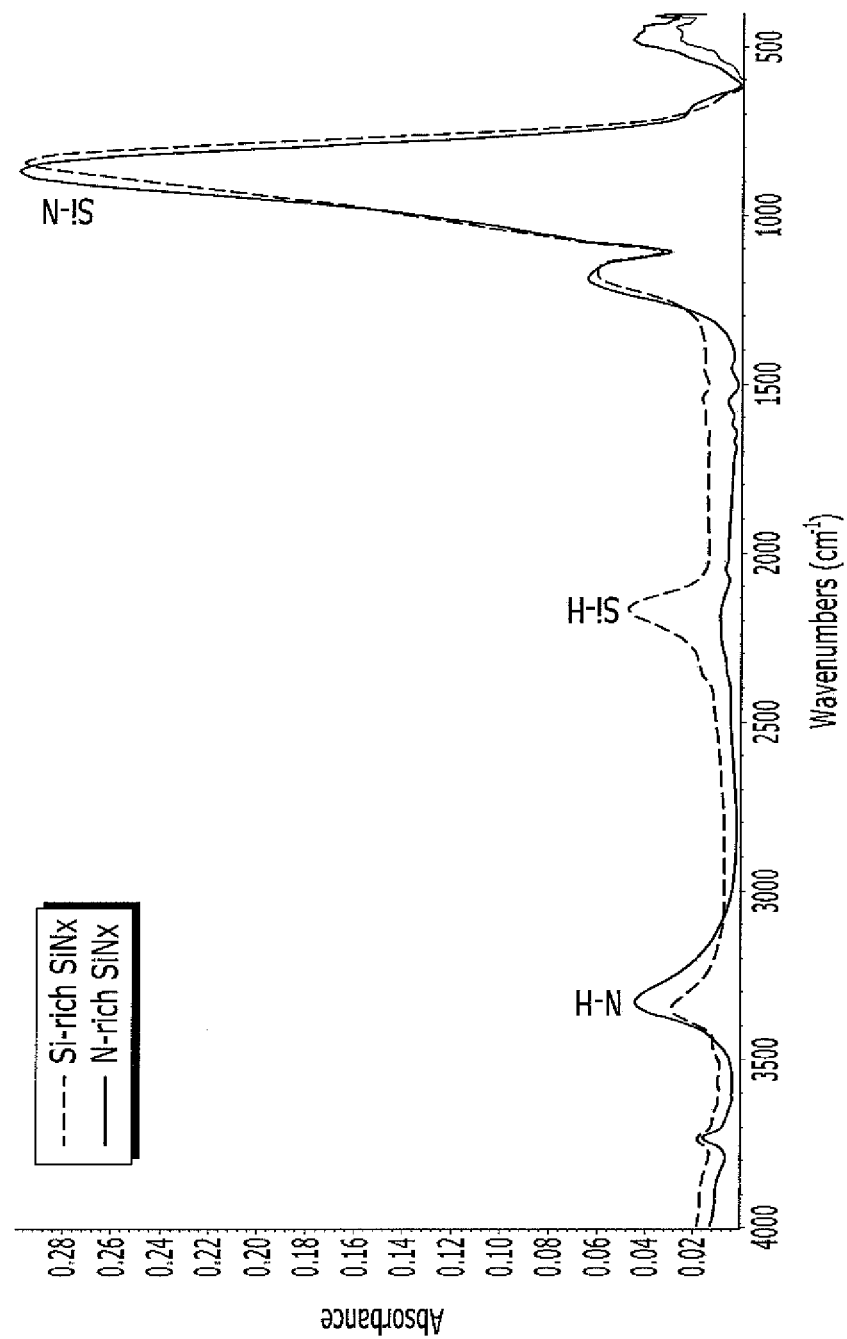
FIG. 3 is a graph showing a result of an FT-IR spectrometer measurement in one experimental example of the present invention.

Next, referring to FIG. 3, the content of nitrogen and silicon in the gate insulating layer 140 of the liquid crystal display according to an exemplary embodiment of the present invention will be described. FIG. 3 is a graph showing a result of an FT-IR spectrometer measurement in one experimental example of the present invention.

In the present experimental example, the N-rich silicon nitride having a high nitrogen content and the Si-rich silicon nitride having a high silicon content are analyzed by using the FT-IR spectrometer to measure optical absorbance of a bond that is vibrated according to wavelength, and results thereof are shown in FIG. 3.

A case of a wave number at which a vibration wavelength is about 3300 cm$^{-1}$ is a case that the bond of nitrogen and hydrogen is vibrated, and a case of a wave number at which a vibration wavelength is about 2200 cm$^{-1}$ is a case that the bond of silicon and hydrogen is vibrated.

Referring to FIG. 3, in the case of the silicon nitride having a high nitrogen content, it may be confirmed that the bonding number [Si—H] of the silicon and hydrogen is larger than the bonding number [N—H] of nitrogen and hydrogen, measured by the FT-IR spectrometer. Particularly, in the case of the silicon nitride having a high nitrogen content, the ratio of the bonding number [N—H] of nitrogen and hydrogen for the bonding number [Si—H] of the silicon and hydrogen is in the range of about 13 to about 25.

Also, in the case of the silicon nitride having a high silicon content, it may be confirmed that the bonding number [N—H] of nitrogen and hydrogen is larger than the bonding number [Si—H] of the silicon and hydrogen, measured by the FT-IR spectrometer. Particularly, in the case of the silicon nitride having a high silicon content, the ratio of the bonding number [N—H] of nitrogen and hydrogen to the bonding number [Si—H] of the silicon and hydrogen is in a range of about 0.5 to about 1.5.

Figure 4:
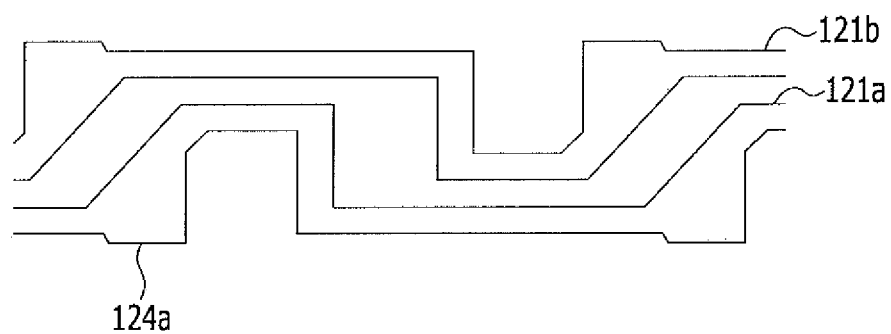
FIG. 4 is a layout view of a liquid crystal display in a manufacturing method of a liquid crystal display according to an exemplary embodiment of the present invention.
Figure 4:
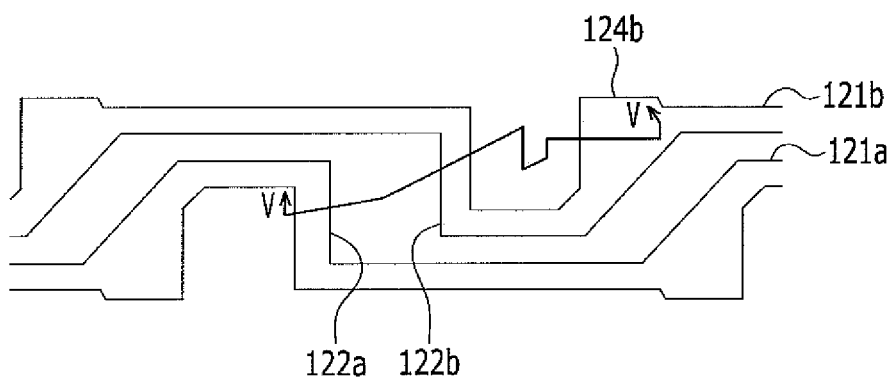
Figure 5:
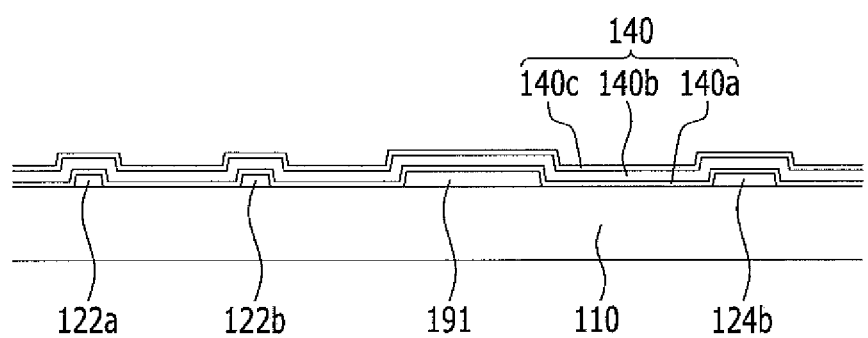
FIG. 5 is a cross-sectional view of the liquid crystal display of FIG. 4 taken along the line V-V.

Next, a manufacturing method of a liquid crystal display according to an exemplary embodiment of the present invention will be described with reference to FIG. 4 to FIG. 9 as well as FIG. 1 and FIG. 2. FIG. 4 is a layout view of a liquid crystal display in a manufacturing method of a liquid crystal display according to an exemplary embodiment of the present invention, and FIG. 5 is a cross-sectional view of the liquid crystal display of FIG. 4 taken along the line V-V. FIG. 6 to FIG. 9 are cross-sectional views sequentially showing a manufacturing method of a liquid crystal display according to an exemplary embodiment of the present invention.

Referring to FIG. 4 and FIG. 5, after forming gate conductors 121a, 121b, 122a, 122b, 124a, and 124b including the first gate line 121a having the first gate electrode 124a, the second gate line 121b having the second gate electrode 124b, and the first field generating electrode 191 on the insulation substrate 110, the gate insulating layer 140 including the first film 140a, the second film 140b positioned on the first film 140a, and the third film 140c positioned on the second film 140b is deposited. Here, before depositing the gate insulating layer 140, plasma treatment is not performed.

This will be described with reference to FIG. 6 to FIG. 9 in detail.

Figure 6:
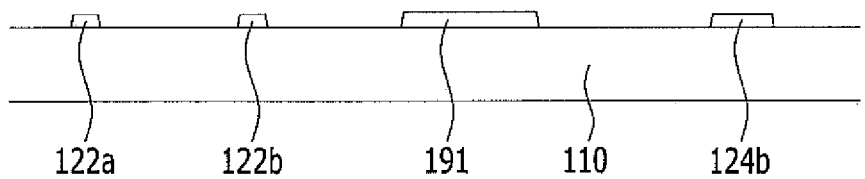
FIG. 6 to FIG. 9 are cross-sectional views sequentially showing a manufacturing method of a liquid crystal display according to an exemplary embodiment of the present invention.

Firstly, as shown in FIG. 6, a conductor including, for example, a low-resistance metal is deposited and patterned by photolithography on the insulation substrate 110 to form the gate conductors 121a, 121b, 122a, 122b, 124a, and 124b, and a transparent conductor such as ITO (indium tin oxide), IZO (indium zinc oxide), AZO (aluminum doped ZnO), CZO (cadmium zinc oxide), and/or IGZO (indium gallium zinc oxide) is deposited and patterned by, for example, photolithography to form the first field generating electrode 191. The conductor including the low-resistance metal may include, for example, at least one of the copper-containing metal such as copper (Cu) or copper alloys, the aluminum-containing metal such as aluminum (Al) or aluminum alloys (e.g. aluminum neodymium), the silver-containing metal such as silver (Ag) or silver alloys, and the gold-containing metal such as gold (Au) or gold alloys.

Figure 7:
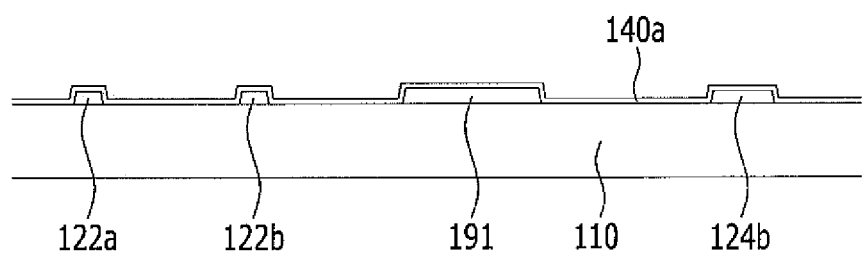

Next, without the plasma treatment for the substrate including the gate conductors 121a, 121b, 122a, 122b, 124a, and 124b and the first field generating electrode 191, as shown in FIG. 7, the first film 140a made of, for example, the silicon nitride layer having a high nitrogen content is deposited. At this time, deposition is performed with a relatively slow deposition rate by, for example, plasma enhanced chemical vapor deposition (PECVD) in a gas atmosphere including nitrogen such that the first film 140a made of the silicon nitride layer having a high nitrogen content may be deposited.

At this time, if the silicon nitride forming the first film 140a having a high nitrogen content is analyzed by, for example, the FT-IR spectrometer, the ratio of the bonding number of [N—H] of nitrogen and hydrogen to the bonding number of [Si—H] of silicon and hydrogen, that is, the value of [N—H]/[Si—H], is in the range of about 13 to about 25. The silicon nitride having a high nitrogen content has high density and is deposited with the slow deposition speed, but unnecessary bonding with the low-resistance metal layer is prevented, thereby preventing the hillock of the gate conductors 121a, 121b, 122a, 122b, 124a, and 124b.

Figure 8:
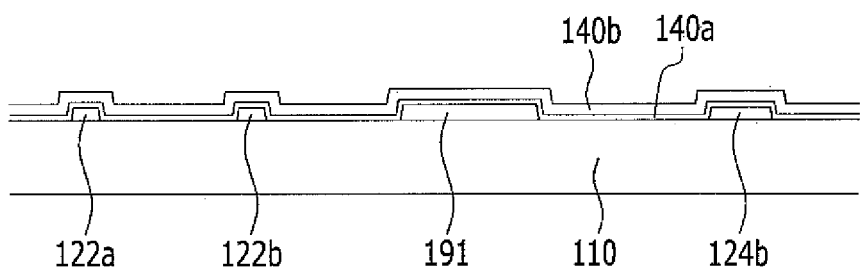

Next, as shown in FIG. 8, the second film 140b made of the silicon nitride layer having a high silicon content is deposited.

At this time, deposition is performed with a relatively fast deposition rate by, for example, the plasma enhanced chemical vapor deposition (PECVD) in the gas atmosphere including nitrogen such that the second film 140b made of the silicon nitride layer having a high silicon content may be deposited. At this time, if the silicon nitride forming the second film 140b having a high silicon content is analyzed by the FT-IR spectrometer, the ratio of the bonding number of [N—H] of nitrogen and hydrogen to the bonding number of [Si—H] of silicon and hydrogen, that is, the value of [N—H]/[Si—H], is in the range of about 13 to about 25. The silicon nitride layer having a high silicon content has low density and is deposited with the fast deposition speed such that a film of a desired thickness may be deposited relatively quickly.

Figure 9:
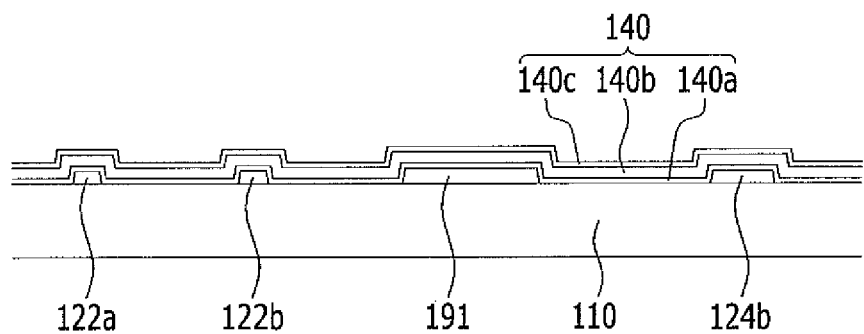

Next, as shown in FIG. 9, the third film 140c made of the silicon nitride layer having a high nitrogen content is deposited. At this time, the deposition is performed with a relatively slow deposition rate by, for example, the plasma enhanced chemical vapor deposition (PECVD) in the gas atmosphere including nitrogen such that the third film 140c made of the silicon nitride layer having a high nitrogen content may be deposited.

Further, if the silicon nitride forming the third film 140c having the high nitrogen content is analyzed by the FT-IR spectrometer, the ratio of the bonding number of [N—H] of nitrogen and hydrogen to the bonding number of [Si—H] of silicon and hydrogen, that is, the value of [N—H]/[Si—H], is in the range of about 13 to about 25.

In the manufacturing method of the liquid crystal display according to the present exemplary embodiment, the gate insulating layer 140 may be, for example, a single layer or a multilayer in which the film made of the (N-rich) silicon nitride having a high nitrogen content starts and the film made of the (N-rich) silicon nitride having a high nitrogen content ends.

For example, in the manufacturing method of the liquid crystal display according to an exemplary embodiment of the present invention, the gate insulating layer 140 is formed by depositing the first film 140a made of the N-rich silicon nitride having a high nitrogen content, the second film 140b made of the Si-rich silicon nitride having a high silicon content on the first film 140a, and the third film 140c made of the N-rich silicon nitride having a high nitrogen content on the second film 140b.

However, in the manufacturing method of the liquid crystal display according to an exemplary embodiment of the present invention, the gate insulating layer 140 may be formed by sequentially depositing the first film made of the N-rich silicon nitride (SiNx) having a high nitrogen content, the second film made of the Si-rich silicon nitride having a high silicon content, the third film made of the N-rich silicon nitride (SiNx) having a high nitrogen content, the fourth film made of the Si-rich silicon nitride having a high silicon content, and the fifth film made of the N-rich silicon nitride (SiNx) having a high nitrogen content.

Also, in the manufacturing method of the liquid crystal display according to an exemplary embodiment of the present invention, the gate insulating layer 140 may be formed by, for example, sequentially depositing the first film made of the N-rich silicon nitride (SiNx) having a high nitrogen content, the second film made of the Si-rich silicon nitride having a high silicon content, the third film made of the N-rich silicon nitride (SiNx) having a high nitrogen content, the fourth film made of the N-rich silicon nitride (SiNx) having a high nitrogen content, the fifth film made of the Si-rich silicon nitride having a high silicon content, and the sixth film made of the N-rich silicon nitride (SiNx) having a high nitrogen content.

Next, as shown in FIG. 1 and FIG. 2, the first and second semiconductors 154a and 154b, the ohmic contacts 163 and 165, the data conductors including the first and second data lines 171a and 171b, the first and second drain electrodes 175a and 175b, and the plurality of reference voltage lines 131, the passivation layer 180, and the second field generating electrode 270 are formed on the third film 140c made of the silicon nitride layer having a high nitrogen content to complete the lower panel 100.

The third film 140c of the gate insulating layer 140 positioned on the first and second semiconductors 154a and 154b is formed of the silicon nitride layer having the high nitrogen content such that the contact characteristic of the first and second semiconductors 154a and 154b and the gate insulating layer 140 is excellent.

Next, the upper panel 200 is formed and the liquid crystal layer 3 is injected between the lower panel 100 and the upper panel 200 to complete the liquid crystal display.

As described above, in the manufacturing method of the liquid crystal display according to an exemplary embodiment of the present invention, the first film 140a of the gate insulating layer 140 contacting the first and second gate lines 121a and 121b and the first field generating electrode 191 is formed of silicon nitride having a high nitrogen content of the value of about 13 to about 25 as the ratio of the bonding number [N—H] of nitrogen and hydrogen to the bonding number [Si—H] of silicon and hydrogen, measured by an FT-IR spectrometer, thereby preventing the hillock with the low-resistance metal such as copper while omitting the hydrogen plasma treatment. Therefore, the haze of the transparent conductor including indium may be prevented.

Also, the third film 140c of the gate insulating layer 140 contacting the first and second semiconductors 154a and 154b is formed of silicon nitride having a high nitrogen content of the value [N—H]/[Si—H] of about 13 to about 25 measured by an FT-IR spectrometer such that the contact characteristic between the gate insulating layer 140 and the first and second semiconductor 154a and 154b is good, thereby preventing the characteristic deterioration of the first and second semiconductors 154a and 154b.

As described above, in the manufacturing method of the liquid crystal display according to an exemplary embodiment of the present invention, the gate insulating layer 140 has a multilayer structure including a layer made of the silicon nitride having a high nitrogen content and a layer made of the silicon nitride having a high silicon content, and the film of the gate insulating layer 140 contacting the first and second gate lines 121a and 121b and the first field generating electrode 191 is formed of silicon nitride having the high nitrogen content of the value [N—H]/[Si—H] of about 13 to about 25 measured by an FT-IR spectrometer, thereby preventing the hillock with the low-resistance metal such as, for example, copper while omitting the hydrogen plasma treatment. Therefore, the haze of the transparent conductor including, for example, indium may be prevented. Also, the film of the gate insulating layer 140 contacting the first and second semiconductors 154a and 154b is formed of silicon nitride having the high nitrogen content of the value [N—H]/[Si—H] of about 13 to about 25 measured by an FT-IR spectrometer such that the contact characteristic between the gate insulating layer 140 and the first and second semiconductors 154a and 154b is good, thereby preventing the characteristic deterioration of the first and second semiconductors 154a and 154b.

Figure 10:
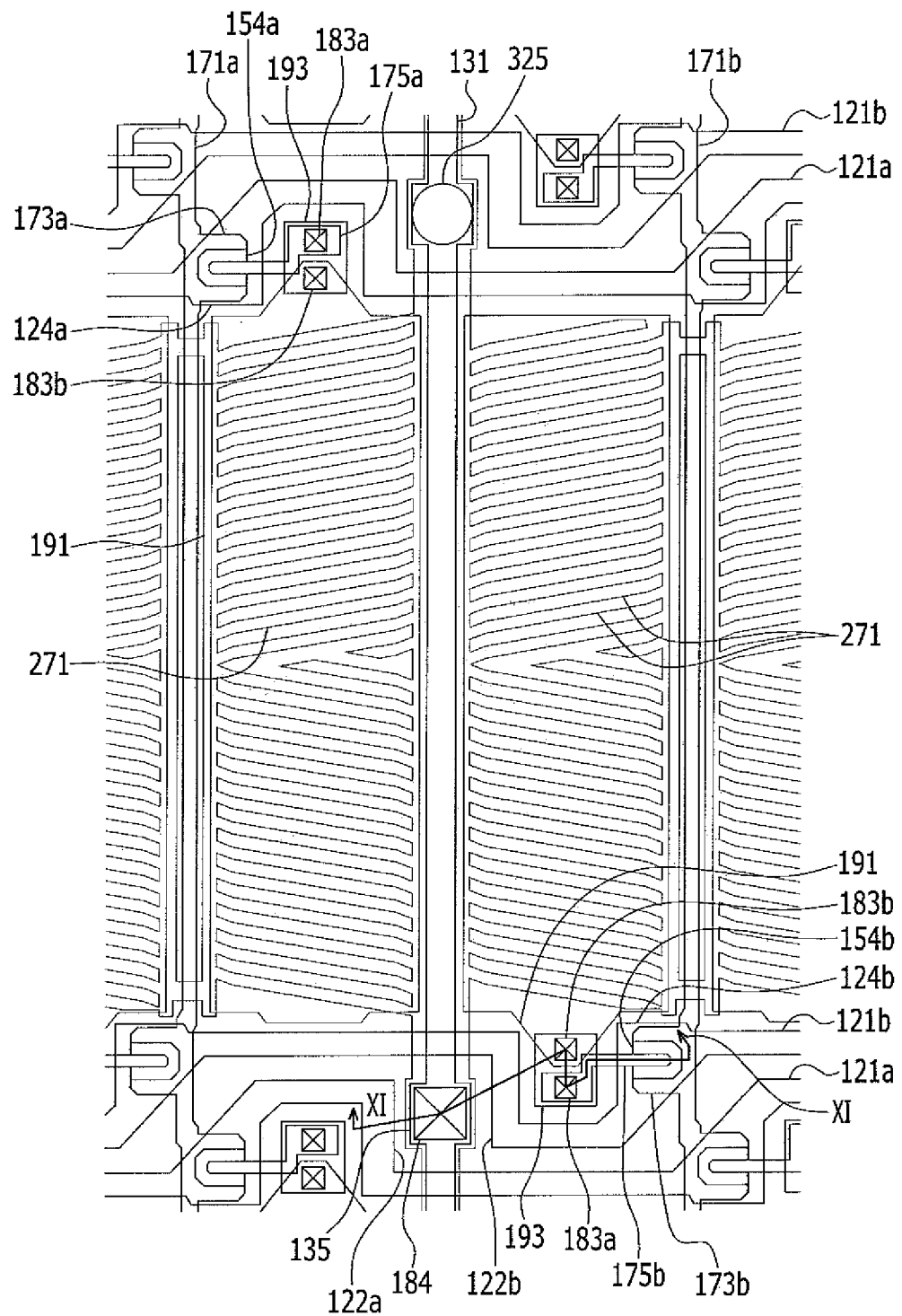
FIG. 10 is a layout view of a liquid crystal display according to an exemplary embodiment of the present invention.

Next, a liquid crystal display according to an exemplary embodiment of the present invention will be described with reference to FIG. 10 and FIG. 11. FIG. 10 is a layout view of a liquid crystal display according to an exemplary embodiment of the present invention, and FIG. 11 is a cross-sectional view of the liquid crystal display of FIG. 10 taken along the line XI-XI.

Figure 11:
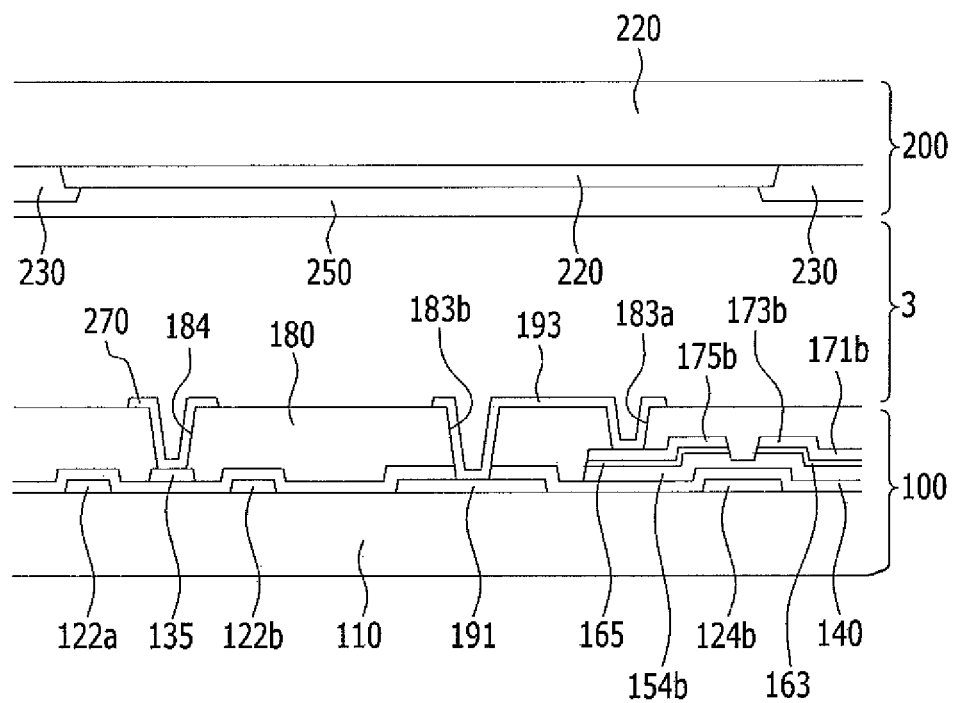
FIG. 11 is a cross-sectional view of the liquid crystal display of FIG. 10 taken along the line XI-XI.

Referring to FIG. 10 and FIG. 11, the liquid crystal display according to the present exemplary embodiment is similar to the liquid crystal display a shown in FIG. 1 and FIG. 2. A detailed description of the same elements will be omitted.

However, differently from the liquid crystal display shown in FIG. 1 and FIG. 2, the lower panel 100 of the liquid crystal display according to the present exemplary embodiment includes a gate insulating layer 140 formed of a singular film.

The gate insulating layer 140' according to the present exemplary embodiment is made of the N-rich silicon nitride (SiNx) having a high nitrogen content like the first film 140a of the gate insulating layer 140 of the liquid crystal display of FIG. 1 and FIG. 2. If the gate insulating layer 140' is analyzed by the FT-IR spectrometer, for the ratio of the bonding number [N—H] of nitrogen and hydrogen to the bonding number [Si—H] of silicon and hydrogen, the value [N—H]/[Si—H] is in the range of, for example, about 13 to about 25.

As described above, according to the liquid crystal display of an exemplary embodiment of the present invention, the gate insulating layer 140' contacting the first and second gate lines 121a and 121b and the first field generating electrode 191 is formed of the silicon nitride having a high nitrogen content of the value [N—H]/[Si—H] of about 13 to about 25 measured by an FT-IR spectrometer, thereby preventing the hillock with the low-resistance metal such as copper while omitting the hydrogen plasma treatment. Therefore, the haze of the transparent conductor including indium may be prevented.

Also, the gate insulating layer 140 contacting the first and second semiconductor 154a and 154b is formed of the silicon nitride having the high nitrogen content of the value [N—H]/[Si—H] of about 13 to about 25 measured by an FT-IR spectrometer such that the contact characteristic of the gate insulating layer 140 and the first and second semiconductors 154a and 154b is increased, thereby preventing the characteristic deterioration of the first and second semiconductors 154a and 154b.

Many characteristics according to the liquid crystal display of FIG. 1 to FIG. 2 may be applied to the liquid crystal display according to the present exemplary embodiment.

Next, the hillock of the gate conductor and the haze of the first field generating electrode in a liquid crystal display according to experimental examples will be described with reference to FIGS. 12(a)-(b). FIG. 12(a) is a view showing an electron microscope photograph for measuring a portion of a pixel in an experimental example in accordance with a conventional liquid crystal display. FIG. 12(b) is a view showing an electron microscope photograph for measuring a portion of a pixel in an experimental example in accordance with an exemplary embodiment of the present invention.

In the present experimental example, like a conventional liquid crystal display and a conventional manufacturing method of the liquid crystal display, a gate conductor made of the low-resistance conductor and the first field generating electrode made of the transparent conductor is formed, and then the hydrogen plasma treatment is performed. The gate insulating layer made of the silicon nitride is deposited and then a surface thereof is measured with an electron microscope and is shown in FIG. 12 (a).

Figure 12:
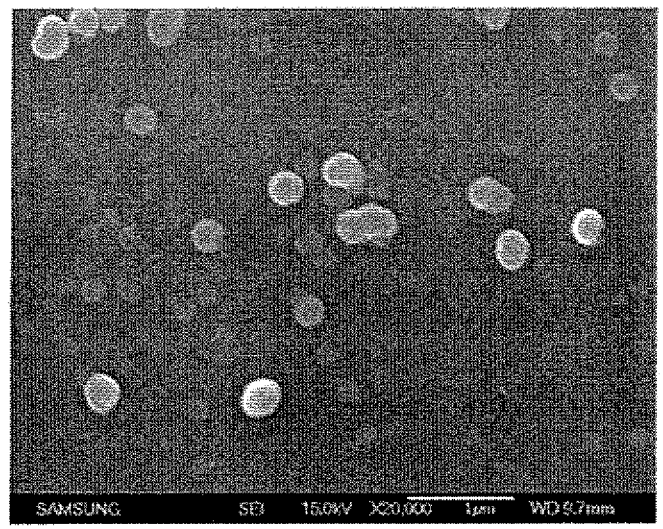
FIG. 12(a) is a view showing an electron microscope photograph for measuring a portion of a pixel in an experimental example in accordance with a conventional liquid crystal display.
FIG. 12(b) is a view showing an electron microscope photograph for measuring a portion of a pixel in an experimental example in accordance with an exemplary embodiment of the present invention.
Figure 12:
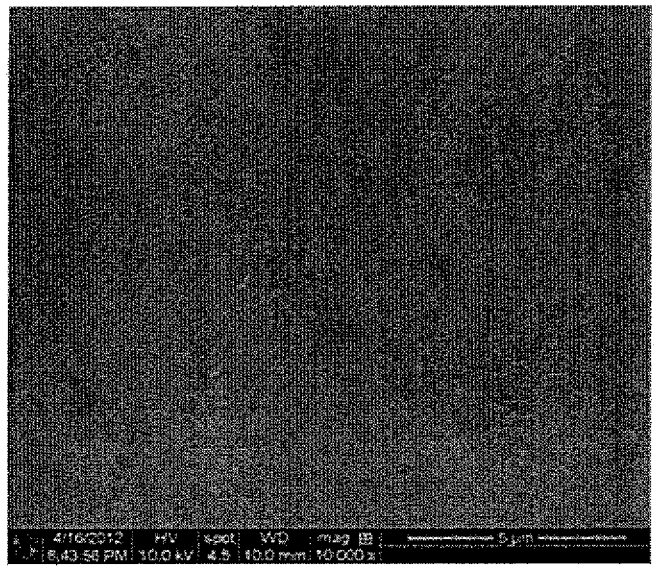

Also, in the present experimental example, like the liquid crystal display and the manufacturing method of the liquid crystal display according to an exemplary embodiment of the present invention, after forming the gate conductor made of the low-resistance conductor and the first field generating electrode made of the transparent conductor, without the hydrogen plasma treatment, the gate insulating layer made of the silicon nitride having a high nitrogen content, in detail, the value [N—H]/[Si—H] of about 13 to about 25 measured by the FT-IR spectrometer, is deposited, and then the surface is measured with the electron microscope and the result thereof is shown in FIG. 12 (b).

Referring to FIG. 12 (b), like the liquid crystal display and the manufacturing method of the liquid crystal display according to an exemplary embodiment of the present invention, in the case that the gate conductor made of the low-resistance conductor and the first field generating electrode made of the transparent conductor are formed without the hydrogen plasma treatment, the gate insulating layer made of the silicon nitride having the high nitrogen content is deposited, and it may be confirmed that the hillock of the low-resistance conductor and the haze are not generated as shown in FIG. 12(b).

In contrast, like the conventional liquid crystal display and the manufacturing method of the liquid crystal display, when the gate conductor made of the low-resistance conductor and the first field generating electrode made of the transparent conductor are formed and the hydrogen plasma treatment is performed, and then the gate insulating layer made of silicon nitride is deposited, it may be confirmed that the hillock of the low-resistance conductor and the haze are seriously generated as shown in FIG. 12(a).

As described above, in the liquid crystal display and the manufacturing method of the liquid crystal display according to an exemplary embodiment of the present invention, after forming the gate conductor made of the low-resistance conductor and the first field generating electrode made of the transparent conductor without the hydrogen plasma treatment, the gate insulating layer made of the silicon nitride having a high nitrogen content, in detail, the value [N—H]/[Si—H] of about 13 to about 25 measured by the FT-IR spectrometer, is deposited, thereby preventing the hillock with the low-resistance metal such as copper while omitting the hydrogen plasma treatment and preventing the haze of the transparent conductor including indium.

In the above-described exemplary embodiments, it has been described that either one of two field generating electrodes overlapping each other, that is, either one of the first and second field generating electrodes, has a plate shape, and the other has a branch form. However, exemplary embodiments of the present invention are not limited thereto, but may be applied to all types of thin film transistor array panels having two field generating electrodes in one array panel.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A liquid crystal display comprising:
   an insulation substrate;
   a gate line disposed on the insulation substrate;
   a first field generating electrode disposed on the insulation substrate;
   a gate insulating layer disposed on the gate line and the first field generating electrode;
   a semiconductor disposed on the gate insulating layer; and
   a data line disposed on the gate insulating layer,
   wherein the first field generating electrode is disposed between the insulation substrate and the gate insulating layer, wherein the first field generating electrode contacts the gate insulating layer, wherein the first field generating electrode comprises a transparent conductor including indium, and wherein a value [N—H]/[Si—H] of the gate insulating layer is in a range of about 13 to about 25, wherein the value [N—H]/[Si—H] means a ratio of a bonding number [N—H] of nitrogen and hydrogen to a bonding number [Si—H] of silicon and hydrogen according to analysis of an FT-IR spectrometer.

2. A liquid crystal display comprising:
an insulation substrate;
a gate line disposed on the insulation substrate;
a first field generating electrode disposed on the insulation substrate;
a gate insulating layer disposed on the gate line and the first field generating electrode;
a semiconductor disposed on the gate insulating layer; and
a data line disposed on the gate insulating layer,
wherein a value [N—H]/[Si—H] of the gate insulating layer is in a range of about 13 to about 25, wherein the value [N—H]/[Si—H] means a ratio of a bonding number [N—H] of nitrogen and hydrogen to a bonding number [Si—H] of silicon and hydrogen according to analysis of an FT-IR spectrometer, and
wherein the gate insulating layer includes a first film contacting the gate line and the first field generating electrode, a second film disposed on the first film, and a third film disposed on the second film.

3. The liquid crystal display of claim 2, wherein the semiconductor contacts the third film, and wherein the value [N—H]/[Si—H] of the first film is in a range of about 13 to about 25.

4. The liquid crystal display of claim 3, wherein the value [N—H]/[Si—H] of the second film of the gate insulating layer is in a range of about 0.5 to about 1.0.

5. A liquid crystal display comprising:
an insulation substrate;
a gate line disposed on the insulation substrate;
a first field generating electrode disposed on the insulation substrate;
a gate insulating layer disposed on the gate line and the first field generating electrode;
a semiconductor disposed on the gate insulating layer; and
a data line disposed on the gate insulating layer,
wherein a value [N—H]/[Si—H] of the gate insulating layer is in a range of about 13 to about 25, wherein the value [N—H]/[Si—H] means a ratio of a bonding number [N—H] of nitrogen and hydrogen to a bonding number [Si—H] of silicon and hydrogen according to analysis of an FT-IR spectrometer, and
wherein the gate insulating layer is a single layer.

6. The liquid crystal display of claim 1, wherein the gate line is made of a low-resistance metal.

7. The liquid crystal display of claim 1, further comprising: a second field generating electrode disposed on the substrate.

8. The liquid crystal display of claim 7, wherein the second field generating electrode overlaps the first field generating electrode via an insulating layer.

9. The liquid crystal display of claim 8, wherein at least one of the first field generating electrode and the second field generating electrode has a plurality of branch electrodes.

10. The liquid crystal display of claim 9, wherein the second field generating electrode comprises a transparent conductor including indium.

11. The liquid crystal display of claim 2, wherein the gate line is made of a low-resistance metal.

12. The liquid crystal display of claim 2, further comprising:
a second field generating electrode disposed on the substrate, and
wherein the second field generating electrode overlaps the first field generating electrode via an insulating layer.

13. The liquid crystal display of claim 12, wherein at least one of the first field generating electrode and the second field generating electrode has a plurality of branch electrodes.

14. The liquid crystal display of claim 12, wherein the first field generating electrode and the second field generating electrode comprises a transparent conductor including indium.

15. The liquid crystal display of claim 5, wherein the gate line is made of a low-resistance metal.

16. The liquid crystal display of claim 5, further comprising: a second field generating electrode disposed on the substrate, and
wherein the second field generating electrode overlaps the first field generating electrode via an insulating layer.

17. The liquid crystal display of claim 16, wherein at least one of the first field generating electrode and the second field generating electrode has a plurality of branch electrodes.

18. The liquid crystal display of claim 16, wherein the first field generating electrode and the second field generating electrode comprises a transparent conductor including indium.

* * * * *